United States Patent
Tomomura

(10) Patent No.: US 6,358,822 B1
(45) Date of Patent: Mar. 19, 2002

(54) METHOD OF EPITAXIALLY GROWING III-V COMPOUND SEMICONDUCTOR CONTAINING NITROGEN AND AT LEAST ANOTHER GROUP V ELEMENT UTILIZING MBE

(75) Inventor: Yoshitaka Tomomura, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/402,051

(22) PCT Filed: Mar. 26, 1998

(86) PCT No.: PCT/JP98/01347

§ 371 Date: Feb. 7, 2000

§ 102(e) Date: Feb. 7, 2000

(87) PCT Pub. No.: WO98/44539

PCT Pub. Date: Oct. 8, 1998

(30) Foreign Application Priority Data

Mar. 28, 1997 (JP) .............................. 9-076386

(51) Int. Cl.⁷ .......................... H01L 21/20; H01L 21/36; C30B 23/00

(52) U.S. Cl. .......................... 438/483; 438/487; 117/92; 117/103; 117/108

(58) Field of Search .......................... 438/46, 483, 487; 117/92, 103, 108

(56) References Cited

U.S. PATENT DOCUMENTS 5,300,186 A * 4/1994 Kitahara ..................... 156/613
5,602,418 A * 2/1997 Iami et al. .................. 257/627
5,689,123 A * 11/1997 Major et al. ................ 257/190

(List continued on next page.)

FOREIGN PATENT DOCUMENTS

JP 5-55631 A 3/1993
JP 5-109636 A 4/1993
JP 6-84796 A 3/1994

(List continued on next page.)

OTHER PUBLICATIONS

Li et al, Journal of Crystal Growth 164 (1996) 180–184.*
Baillargeon et al, Appl. Phys. Lett. 60 (20), May 18 1992, 2540–2542.*
Yang et al, Appl. Phys. Lett. 67 (12), Sep. 18, 1995, 1686–1688.*
Oyo Butsuri, M. Dondo et al., vol. 65, 1996, p.148.
Electronic Letters, vol. 32, No. 17, Aug. 15th 1996, p. 1586.

(List continued on next page.)

Primary Examiner—Matthew Smith
Assistant Examiner—Craig P. Lytle
(74) Attorney, Agent, or Firm—Birch, Stewart, Kolasch & Birch, LLP

(57) ABSTRACT

A method of manufacturing a compound semiconductor is provided which can produce a mixed crystal layer with high nitrogen content without lowering the crystallinity when a III-V compound semiconductor layer including nitrogen and at least another V group element is grown by molecular beam epitaxy.

The method of manufacturing a compound semiconductor is characterized in that a III-V compound semiconductor crystal including nitrogen and at least another V group element is grown by irradiating the substrate with material molecular beams in a crystal growth chamber so evacuated that the mean free path of material molecules is larger than the distance between the substrate and the molecular beam sources, a nitrogen compound is used as the nitrogen sources, molecules of the nitrogen compound decompose after they reach the substrate surface, and only nitrogen atoms are incorporated into the growing semiconductor crystal

26 Claims, 8 Drawing Sheets

U.S. PATENT DOCUMENTS 5,945,690 A * 8/1999 Saito et al. .................... 257/94
6,017,774 A * 1/2000 Yuasa et al. .................. 438/46

FOREIGN PATENT DOCUMENTS

| | | | |
|---|---|---|---|
| JP | 06084796 A | * | 3/1994 |
| JP | 6-334168 A | | 12/1994 |
| JP | 8-316151 A | | 11/1996 |
| JP | 8-325094 A | | 12/1996 |
| JP | 9-23026 A | | 1/1997 |
| JP | 9-36427 A | | 2/1997 |
| JP | 9-134878 A | | 5/1997 |
| JP | 9-134881 A | | 5/1997 |
| JP | 10-12924 A | | 1/1998 |

OTHER PUBLICATIONS

"GaN grown by molecular beam epitaxy at high growth rates using . . . ", Z. Yang et al., Appl. Phys. Lett. 67 (12), Sep. 18, 1995, pp. 1686–1688.

"Luminescence quenching and the formation of the GaP–xNx alloy. . . ", J.N. Baillargeon et al., Appl. Phys. Lett. 60 (20), May 18, 1992, pp. 2540–2542.

* cited by examiner

F I G. 4
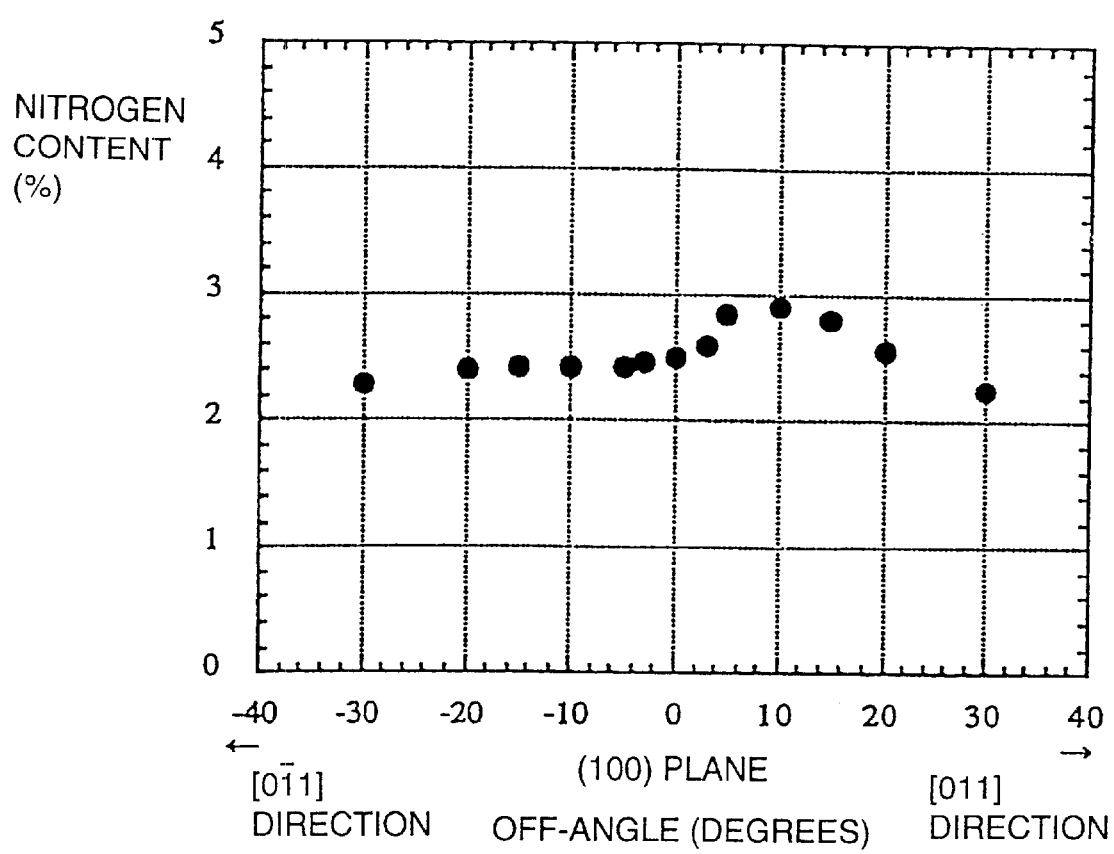

METHOD OF EPITAXIALLY GROWING III-V COMPOUND SEMICONDUCTOR CONTAINING NITROGEN AND AT LEAST ANOTHER GROUP V ELEMENT UTILIZING MBE

This application is the national phase under 35 U.S.C. §371 of PCT International Application No. PCT/JP98/01347 which has an International filing date of Mar. 26, 1998 which designated the United States of America.

TECHNICAL FIELD

The present invention relates to a method of manufacturing a III-V compound semiconductor which includes nitrogen and at least another Group V element, by irradiating a substrate with molecular beams of source materials in a growth chamber being so evacuated that a mean free path of the molecular beams is larger than a distance between the substrate and a molecular beam source, as in a molecular beam epitaxy (MBE) method, a gas source MBE (GSMBE) method, a chemical beam epitaxy (CBE) method, a metal organic molecular epitaxy (MOMBE) method, and so on.

BACKGROUND ART

Recently, III-V compound semiconductors which each include nitrogen and at least another Group V element have been drawing attention as optoelectronic materials, because the lattice constants and energy bandgaps of the III-V compound semiconductors can been controlled in wide ranges by changing their mixed crystal compositions. Among others, GaInNAs has a bandgap desirable for an active layer of a laser used for optical fiber communication which emits light in a band including a wavelength of 1.3 $\mu$m or 1.5 $\mu$m and its composition enables lattice matching with GaAs, and can attain a large band offset of its conduction band through combination with AlGaAs or InGaP. Therefore GaInNAs is expected to be a material capable of implementing a semiconductor laser for optical fiber communication which has an improved temperature characteristic that necessary current for light emission does not increase very much even if temperature increases (see, for example, OYO BUTSURI, vol. 65, 1996, p. 148).

For crystal growth using the molecular beam epitaxy (MBE) method, the gas source MBE (GSMBE) method, the chemical beam epitaxy (CBE) method, the metal organic molecular epitaxy (MOMBE) method and the like (hereinafter, these methods are generically referred to as the MBE method) which are used for forming a III-V compound semiconductor, including nitrogen and another Group V element, such as GaInNAs, active nitrogen (nitrogen radical) which is generated from plasma of nitrogen molecules ($N_2$) or ammonia ($NH_3$) has been used in view of the incorporation efficiency of nitrogen into a crystal to be grown (see Japanese Patent Laying-Open No. 6-334168).

By using to the MBE method which uses nitrogen radical as a nitrogen source, however, the crystal growth of a III-V compound semiconductor which includes nitrogen and another Group V element has a problem that crystallinity of the semiconductor decreases with increase of the nitrogen concentration. In a semiconductor laser in which $Ga_{0.75}In_{0.25}N_{0.005}As_{0.995}$ is used for an active layer of a single quantum well (SQW), for example, laser oscillation at a wavelength of 1.113 $\mu$m at 77K has been reported (see Electronics Letters, vol. 32, 1996, p. 1586). However, laser oscillation in the band including a wavelength of 1.3 $\mu$m or 1.55 $\mu$m, which is used for optical fiber communication, has not been achieved.

In order to obtain an energy bandgap which corresponds to the oscillation wavelength of at least 1.3 $\mu$m in the GaInNAs type mixed crystal capable of lattice matching with GaAs, the nitrogen content in V group elements has to be at least about 2.5 at. % larger than conventional 0.5 at. %. It has been found out however that the crystallinity decreases with increase of the nitrogen content in the semiconductors grown by the conventional MBE method using a nitrogen radical.

This could be because when a nitrogen radical is used as the nitrogen source, crystal defects are induced by high reactivity or high energy of the nitrogen radical. Due to the high reactivity of nitrogen radical, nitrogen easily bonds with the III group element and is incorporated at high efficiency into the growing crystal. At the same time, nitrogen easily bonds with the V group element other than nitrogen and forms nitrogen compound molecules. Since the nitrogen compound molecules are also incorporated into the crystal, crystal defects such as a Group V element at an antisite (Group V element at a lattice site which should be occupied by the Group III element) and interstitial atoms may be induced. At this time, even if N—N bonds are produced, $N_2$ molecules have a high vapor pressure, and they are less likely to be incorporated into the crystal. Thus, the crystallinity is lowered when the Group V element other than nitrogen bonds with nitrogen.

It is further considered that energy emitted from nitrogen radical dissociates the bond between the Group III element and the Group V element other than nitrogen (Ga—As bond, for example) in the vicinity of growth surface, desorbing the Group V element, which has a relatively high vapor pressure, and thus creating vacancies. Since the bond between the Group III element and nitrogen is strong and stable, the crystallinity is lowered especially in a III-V compound semiconductor which includes another Group V group element having a weaker bonding strength with the III group element as compared with nitrogen.

Therefore, when a crystal of the III-V compound semiconductor which includes nitrogen and another Group V element is to be grown by the MBE method using nitrogen radical, the increased amount of nitrogen radical supply to increase the nitrogen content in the crystal makes it difficult to obtain a high quality crystal.

In view of the above described problems with the conventional art, an object of the present invention is to provide a method of manufacturing a compound semiconductor capable of achieving superior crystallinity even in a III-V compound semiconductor which includes nitrogen and at least another Group V element.

DISCLOSURE OF THE INVENTION

A method of manufacturing a compound semiconductor according to one aspect of the present invention is characterized in that a nitrogen compound is used as a nitrogen source, molecules of the nitrogen compound decompose after they reach a surface of a substrate and only nitrogen atoms are incorporated into a III-V compound semiconductor crystal including nitrogen and at least another Group V element when the crystal is grown by irradiating the substrate with molecular beams of source materials in a growth chamber being so evacuated that a mean free path of the molecular beams is larger than a distance between the substrate and molecular beam sources.

In other words, nitrogen atoms are incorporated into the crystal through dissociation and adsorption of the nitrogen compound at the growth surface. Therefore, the reaction of the Group V element other than nitrogen with nitrogen can be suppressed, when the nitrogen compound decomposes, by using the stable nitrogen compound rather than nitrogen radical as the nitrogen sources. Since energy emitted by the reaction in which nitrogen is incorporated into the crystal through the decomposition of the nitrogen compound at the growth surface can be made smaller than energy emitted from nitrogen radical, the dissociation of the bond between the Group III element and the Group V element other than nitrogen in the vicinity of the growth surface can be suppressed, thereby enabling stable crystal growth.

Nitrogen hydride can preferably be used as the nitrogen compound. Since the dissociation energy of nitrogen hydride is smaller compared to an $N_2$ molecule, the dissociation of the hydride and the adsorption of nitrogen at the growth surface can occur at a relatively low temperature. Therefore, the composition ratio of nitrogen and another Group V element in the compound semiconductor to be grown can be controlled easily. Since $H_2$ molecules which are produced by the dissociation of the nitrogen hydride are easily desorbed from the growth surface, undesirable impurities are not incorporated into the crystal. Further, when impurities such as carbon (C) exist at the growth surface, a cleaning effect in which the impurities form hydrides and are adsorbed from the growth surface can be expected.

$NH_3$ can preferably be used as the nitrogen hydride. $NH_3$ is the most stable of nitrogen hydrides, and it can minimize generation of crystal defects, which are caused by the interaction of nitrogen and another Group V element, when nitrogen atoms are incorporated into the crystal through dissociation and adsorption.

When a nitrogen hydride is used as the nitrogen compound, the substrate temperature is preferably maintained in a range of 500 to 750° C. during crystal growth. When $NH_3$ is used as the nitrogen compound, $NH_3$ is preferably heated to a temperature in a range of 350 to 500° C. before it is directed to the substrate.

It is noted that hydrazine ($N_2H_4$) is also preferably used similarly to $NH_3$ as the nitrogen hydride.

An alkylated nitrogen compound is also preferably used as the nitrogen compound. In general, an alkylated nitrogen compound has smaller bond dissociation energy than nitrogen hydride and this results in easier dissociation of the nitrogen compound at the growth surface and increase of the nitrogen incorporation efficiency into the crystal. Since the alkyl group produced by the decomposition of the alkylated nitrogen compound is hydrocarbon having a high vapor pressure, it is easily desorbed from the growth surface and not incorporated into the crystal. Thus, a high purity crystal can be obtained.

It is noted that an alkylated hydrazine compound can also preferably be used as the alkylated nitrogen compound.

Further, alkylamine can also preferably be used as the alkylated nitrogen compound. When the stable alkylamine is used, generation of crystal defects caused by the interaction of nitrogen and another Group V element can be minimized while nitrogen atoms are incorporated into the crystal through dissociation and adsorption at the growth surface. When the alkylamine compound is used as the nitrogen compound, the substrate temperature is preferably maintained in a range of 400 to 750° C. during crystal growth.

The substrate is preferably a compound semiconductor which has a zinc blende structure. The substrate surface preferably has a prescribed off-angle from a {100} plane to a {111}A plane. At the surface of such a compound semiconductor substrate, decomposition of the nitrogen compound is promoted, and the high incorporation efficiency of nitrogen into the crystal can be achieved even when the nitrogen compound which is lower in reactivity than nitrogen radical is used. Especially, the off-angle of the substrate surface is preferably in a range of 5 to 15°.

When the Group V element is supplied on the substrate, the process of directing nitrogen compound molecules to the growth surface and the process of directing another Group V element to the growth surface are preferably performed alternately without being overlapped. By separately supplying the nitrogen material and another Group V element on the substrate, the interaction of nitrogen and another Group V element can be reduced. Therefore, the incorporation efficiency of nitrogen into the crystal can be improved, and further the reaction of nitrogen and another Group V element can be fully suppressed, which can not fully be achieved only by using one of nitrogen materials other than nitrogen radicals.

A nitrogen compound which has a Gibbs energy of formation of less than 100 kJ/mol is more preferably used as the nitrogen source. By using the nitrogen compound with the Gibbs energy of formation of less than 100 kJ/mol, the reaction of nitrogen and the Group V element other than nitrogen can be suppressed more effectively during the decomposition of the nitrogen compound. At the growth surface, the dissociation of the bond between the Group III element and the Group V element other than nitrogen, possibly caused by the reaction in which nitrogen is incorporated into the crystal through decomposition of the nitrogen compound, can be suppressed more effectively. Thus, a high quality crystal can be obtained.

BRIEF DESCRIPTION OF THE DRAWINGS

FIG. 4 is a graph showing the relationship between the nitrogen content of a GaInNAs film formed in a fourth embodiment of the present invention and the off-angle of a substrate surface from the {100} plane.

BEST MODE FOR CARRYING OUT THE INVENTION

In the following, a mode of the present invention will be described in detail with respect to various embodiments.

First Embodiment

In a first embodiment of the present invention, a single quantum well (SQW) of a combination of GaInNAs and AlGaAs having compositions enabling lattice matching with a GaAs substrate was made by the MBE method which uses $NH_3$ as a nitrogen source and solid materials as other element sources.

Figure 1:
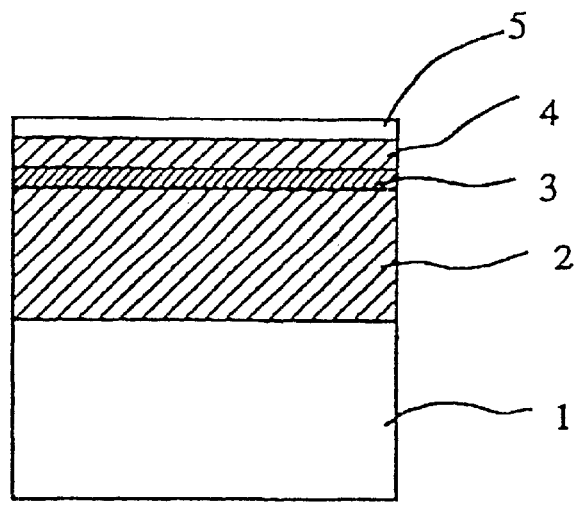
FIG. 1 is a schematic sectional view for explaining a quantum well structure formed in a first embodiment of the present invention.

FIG. 1 shows a schematic sectional view of a quantum well structure which includes such a GaInNAs/AlGaAs-SQW structure. In the quantum well structure, a lower clad layer 2 of $Al_{0.3}Ga_{0.7}As$ having a thickness of 1 μm, a quantum well layer 3 of a GaInNAs mixed crystal having a thickness of 6 nm, an upper clad layer 4 of $Al_{0.3}Ga_{0.7}As$ having a thickness of 0.2 μm, and a cap layer 5 of GaAs having a thickness of 0.1 μm were formed successively, by the MBE method, on a GaAs substrate 1 having just a {100} surface.

For each of the MBE materials Al, Ga and In, a molecular beam was directed to the substrate surface by heating a solid metallic material using a Knudsen cell. For As, an As beam was directed to the substrate surface by heating a solid As material using a cracking cell. For the nitrogen material, 100% $NH_3$ gas was used. $NH_3$ was heated to 350° C., at which $NH_3$ is not decomposed, by a gas source cell, and an $NH_3$ beam was directed to the substrate surface from the gas source cell. By heating $NH_3$ to 100° C. or more, the migration of $NH_3$ molecules are promoted on a growth surface, and the flatness of the growth surface is improved. If $NH_3$ is heated to 500° C. or more by a gas source cell, however, $N_2$ is produced by pyrolysis before $NH_3$ reaches the growth surface, and thus the incorporation efficiency of nitrogen into the crystal is lowered. It is preferred therefore that $NH_3$ is heated to a temperature in a range of 100 to 500° C.

When AlGaAs layers 2, 4 and GaAs layer 5 were grown, the substrate temperature was maintained at 580° C., and then Al=$2 \times 10^{-7}$ Torr (unnecessary for forming the GaAs layer), Ga=$5 \times 10^{-7}$ Torr, and As=$5 \times 10^{-6}$ Torr were used as the respective molecular beam intensities. The growth speed in this case was about 0.5 μm/h in the thickness direction.

In forming GaInNAs mixed crystal layer 3, the substrate temperature was maintained at 580° C., and the molecular beam intensities which were almost proportional to an aimed composition as shown in Table 1 were used for crystal growth.

TABLE 1

| GaInNAs mixed crystal composition | Condition 1 | Condition 2 | Condition 3 |
|---|---|---|---|
| Indium content (%) | 2.8 | 7.1 | 9.9 |
| Nitrogen content (%) | 1.0 | 2.5 | 3.5 |

TABLE 1-continued

| GaInNAs mixed crystal composition | Condition 1 | Condition 2 | Condition 3 |
|---|---|---|---|
| Ga beam intensity (Torr) | $5.0 \times 10^{-7}$ | $5.0 \times 10^{-7}$ | $5.0 \times 10^{-7}$ |
| In beam intensity (Torr) | $1.5 \times 10^{-8}$ | $3.8 \times 10^{-8}$ | $5.5 \times 10^{-8}$ |
| $As_2$ beam intensity (Torr) | $2.5 \times 10^{-6}$ | $2.5 \times 10^{-6}$ | $2.5 \times 10^{-6}$ |
| $NH_3$ gas flow rate (Torr) | $1.7 \times 10^{-7}$ | $4.3 \times 10^{-7}$ | $6.0 \times 10^{-7}$ |

Figure 2:
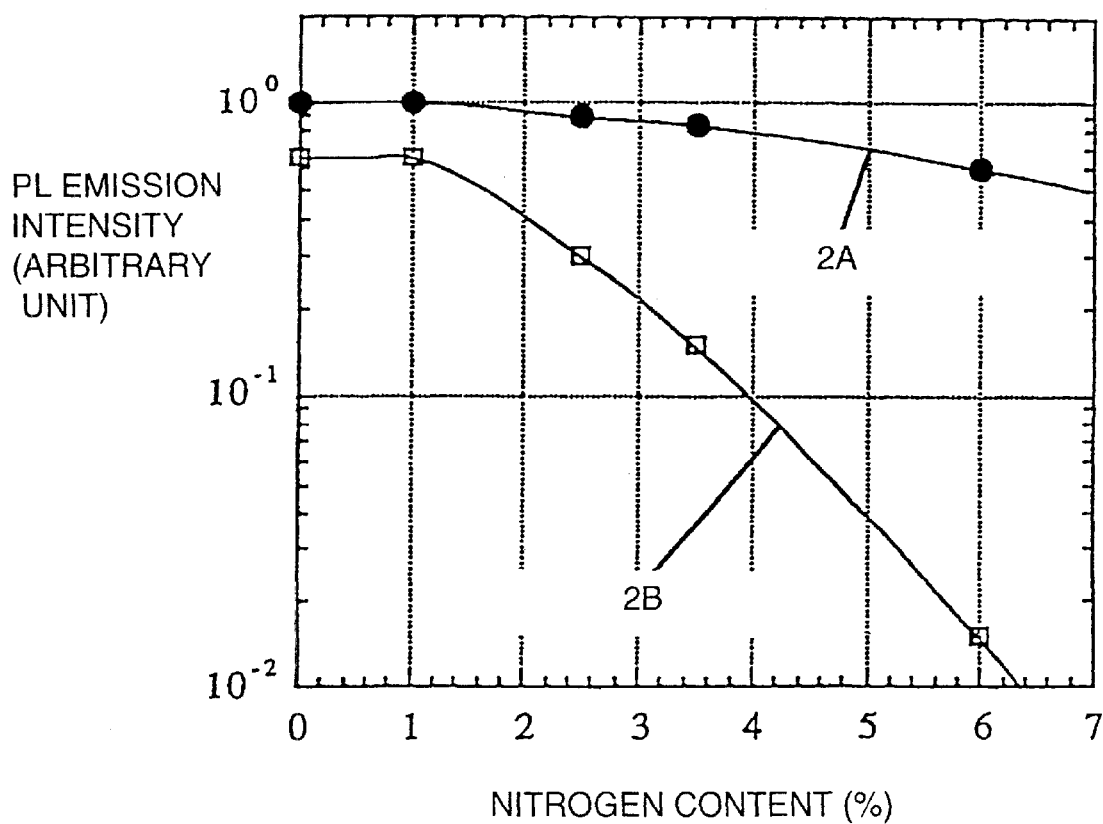
FIG. 2 is a graph showing relations between the nitrogen content and the PL (photoluminescence) emission intensity in a quantum well layer of the quantum well structure formed in the first embodiment of the present invention.

In FIG. 2, dependency of the PL emission intensity on the nitrogen content in the quantum well structure of GaInNAs/AlGaAs-SQW made in the first embodiment is shown in comparison with a quantum well structure formed by the MBE method using nitrogen radical in stead of $NH_3$. In the graph of FIG. 2, the abscissa denotes the nitrogen content (at. %) in the V group elements included in GaInNAs active layer 3, while the ordinate denotes the PL emission intensity (arbitrary unit). Further, a curve 2A including the black circles denotes the PL emission intensity in the quantum well structure in the first embodiment, and a curve 2B including the white circles denotes the PL emission intensity in a conventional quantum well structure formed by utilizing nitrogen radical.

As is apparent from FIG. 2, it was observed that the quantum well structure formed by utilizing $NH_3$ can produce sufficiently strong PL emission even if it has a high nitrogen content of approximately 3.5 at. %. In the quantum well structure formed by utilizing nitrogen radical, however, the PL emission intensity abruptly decreased when the nitrogen content exceeded about 2 at. %. It was also made clear that the quantum well structure formed by utilizing $NH_3$ has improved PL emission intensity, compared with the one formed by utilizing nitrogen radical, even in the low nitrogen content range of less than about 2 at. %.

As is apparent from the result above in the first embodiment, a GaInNAs mixed crystal of a high quality even in the range of a relatively high nitrogen content can be obtained according to the present invention. Further, by forming a semiconductor laser which uses a high quality GaInNAs layer of such a high nitrogen concentration as an active layer, lasing operation at a wavelength of 1.3 μm or 1.55 μm can be achieved with low current, and a long life and high performance semiconductor laser for optical communication can be provided.

Although $NH_3$ of nitrogen hydrides is utilized as the nitrogen source in FIG. 2, hydrazine ($N_2H_4$) and hydrogen azide ($N_3H$) can be used as other nitrogen hydrides. As shown in Table 2, hydrazine and hydrogen azide have smaller bond dissociation energies than $NH_3$ and easily decompose on the growth surface. Thus, the incorporation efficiency of nitrogen into the crystal can be improved.

TABLE 2

| Nitrogen compounds | Dissociation reaction AB → A,B | Bond dissociation energy (0K) D(kJ/mol) | Average bond dissociation energy (0K) D(kJ/mol) |
|---|---|---|---|
| Ammonia ($NH_3$) | $NH_3 \rightarrow NH_2$, H | 446.5 | 385.9 |
|  | $NH_2 \rightarrow NH$, H | 401 |  |
|  | $NH \rightarrow N$, H | 310 |  |

TABLE 2-continued

| Nitrogen compounds | Dissociation reaction AB → A,B | Bond dissociation energy (0K) D(kJ/mol) | Average bond dissociation energy (0K) D(kJ/mol) |
|---|---|---|---|
| Hydrazine ($N_2H_4$) | $N_2H_4$ → $2NH_2$ | 273.8 | 328.3 |
|  | $NH_2$ → NH, H | 401 |  |
|  | NH → N,H | 310 |  |
| Hydrogen azide ($N_3H$) | $N_3H$ → NH, $N_2$ | 76 | 128.7 |
|  | NH → N, H | 310 |  |

As shown in Table 3, however, $NH_3$ has the smallest Gibbs energy of formation of nitrogen hydrides and it is stable. For obtaining a high quality crystal, $NH_3$ is thus preferred in that it can minimize generation of crystal defects, possibly caused by the interaction of nitrogen and the V group element other than nitrogen, when nitrogen atoms are incorporated into the crystal through dissociation and adsorption.

TABLE 3

| Nitrogen compounds | Gibbs energy of formation (298K) ΔG(kJ/mol) |
|---|---|
| Ammonia ($NH_3$) | −103.4 |
| Hydrazine ($N_2H_4$) | 23.8 |
| Hydrogen azide ($N_3H$) | 222.8 |

Although the substrate temperature was maintained at 580° C. in FIG. 2, the substrate temperature in a range of 500 to 750° C. can be used when $NH_3$ is used as the nitrogen source. If the substrate temperature becomes lower than 500° C., the decomposition efficiency of $NH_3$ at the growth surface abruptly decreases, which makes it difficult to grow the mixed crystal including nitrogen. On the other hand, if the substrate temperature exceeds 750° C., desorption of Group V elements other than nitrogen such as As and P generally increases, which increases crystal defects and roughens the crystal surface. It is therefore difficult to obtain a high quality crystal.

Although the $Al_{0.3}Ga_{0.7}As$ layer was used as the clad layer of the SQW structure in FIG. 2, a clad layer of InGaP capable of lattice matching with the GaAs substrate may also be used. Although a GaAs substrate having just a {100} surface was used as the substrate, the substrate surface having a prescribed off-angle from the {100} plane may be used.

Second Embodiment

In a second embodiment of the present invention, a quantum well structure as shown in FIG. 1 was formed similarly to the case of the first embodiment, except that the conditions of forming quantum well layer 3 were changed.

In the second embodiment, dimethylamine was used instead of $NH_3$ as the nitrogen source. Dimethylamine vapor was directed to the substrate surface using a gas source cell similarly to the case of $NH_3$. The gas source cell was heated to a temperature in a range of 50 to 150° C. to prevent recondensation of dimethylamine vapor on the cell. The dimethylamine vapor ejected from the gas source cell heated to the temperature range will not decompose till it reaches the substrate surface.

While quantum well layer 3 was formed, the substrate was maintained at a temperature of 500° C. and the molecular beam intensities were so set that Ga=$5\times10^{-7}$ Torr, In=$3.8\times10^{-7}$ Torr, As=$2.5\times10^{-6}$ Torr, and dimethylamine=$2.1\times10^{-7}$ Torr. In quantum well layer 3 formed in this manner, the In content in the Group III elements was 7.1 at. % and the nitrogen content in the Group V elements was 2.5 at. %.

Figure 3:
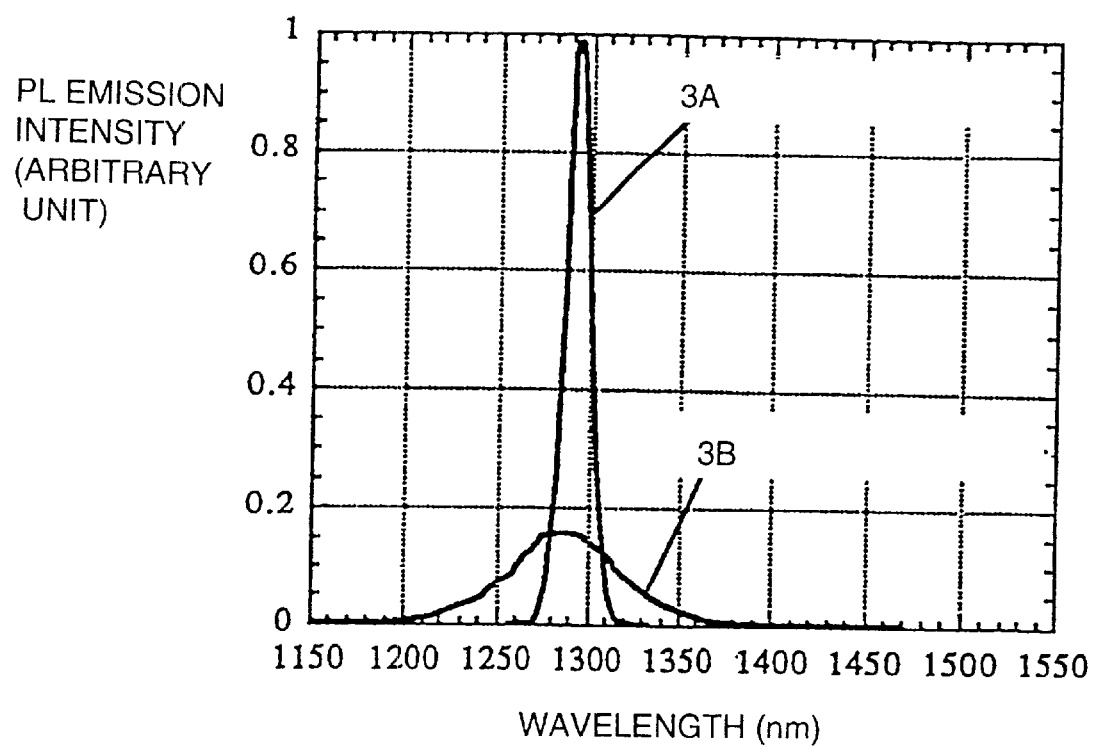
FIG. 3 is a graph showing the PL emission spectrum of a quantum well structure formed in a second embodiment of the present invention.

In FIG. 3, the PL emission spectrum in the quantum well structure in the second embodiment is shown in comparison with a quantum well structure formed by utilizing nitrogen radical. In FIG. 3, the abscissa denotes the wavelength (nm) of light emitted from the quantum well structure, while the ordinate denotes the PL emission intensity (arbitrary unit). Further, a curve 3A corresponds to the quantum well structure formed by utilizing dimethylamine, and a curve 3B corresponds to the quantum well structure formed by utilizing nitrogen radical.

As is apparent from FIG. 3, the quantum well structure which includes quantum well layer 3 formed by the MBE method using not nitrogen radical but dimethylamine can emit PL light which has a high peak intensity and a small half width in the vicinity of a wavelength of 1.3 μm and can achieve a high quality GaInNaAs/AlGaAs-SQW structure. In other words, a high quality GaInNAs mixed crystal can be obtained even by the MBE method which uses dimethylamine as the nitrogen source as in this second embodiment.

Although dimethylamine was used as the alkylated compound including nitrogen in the description of the second embodiment, alkylated compounds such as methylamine, methylhydrazine and methyl azide are also usable, which are formed by substituting alkyl groups for hydrogen atoms in nitrogen hydrides such as $NH_3$, hydrazine and hydrogen azide described in the first embodiment. By substituting alkyl groups for hydrogen atoms in nitrogen hydrides, the bond dissociation energies of nitrogen compounds can be made smaller without substantially changing the Gibbs energies of formation compared with nitrogen hydrides, as shown in Table 4. As a result, the efficiency of dissociating nitrogen hydrides can be improved without increasing the reaction of nitrogen and another Group V element on the growth surface, the incorporation efficiency of nitrogen into the crystal can be improved, and the crystal growth temperature can be lowered.

TABLE 4

| Nitrogen compounds | Bond dissociation energy (0K) D(kJ/mol) | Gibbs energy of formation (298K) ΔG(kJ/mol) |
|---|---|---|
| Ammonia ($NH_3$) | 446.5 ($NH_3$ → $NH_2$, H) | −103.4 |
| Methylamine ($CH_3NH_2$) | 358 ($CH_3NH_2$ → $CH_3$ + $NH_2$) | −95.3 |

Of the alkylated compounds including nitrogen, alkylamine is stable similarly to $NH_3$, and it can minimize generation of crystal defects caused by the interaction of nitrogen and another Group V element when nitrogen atoms are incorporated into the crystal through dissociation and adsorption.

The substrate temperature was maintained at 500° C. while quantum well 3 was formed by using dimethylamine in FIG. 3. When alkylamine is used as the nitrogen source, however, high quality quantum well layer 3 can be grown by maintaining the substrate temperature in a range of 400 to 750° C. That is, when alkylamine is used, quantum well layer 3 can be grown on the substrate surface having a relatively low temperature because the alkylamine easily decomposes compared with $NH_3$, and therefore the higher incorporation efficiency of nitrogen into the crystal can be attained at the same temperature.

Although an $Al_{0.3}Ga_{0.7}As$ layer was used as each of clad layers 2, 4 in the SQW structure in FIG. 3, InGaP capable of lattice matching with the GaAs substrate may be used. Although the just {100} crystal plane was used as the substrate surface, a substrate surface which has a prescribed off-angle with respect to the {100} plane may be used.

Third Embodiment

In a third embodiment of the present invention, a GaInNP mixed crystal was grown on the just {100} plane of a GaP substrate. The substrate was maintained at a temperature of 550° C., PH$_3$ was cracked at 800° C. in a gas source cell, and a P$_2$ beam was directed to the substrate surface. For other elements Ga, In and N, the same materials and cells as the first embodiment were used.

The GaInNP mixed crystal layer was grown to a thickness of 1 μm with such composition (In=5 at. % in the Group III element, N=3 at. % in the Group V element) that enables lattice matching with the GaP substrate. The conditions of molecular beams were Ga=$5.0 \times 10^{-7}$ Torr, In=$2.6 \times 10^{-8}$ Torr, P$_2$(PH$_3$)=$5.0 \times 10^{-6}$ Torr, and NH$_3$=$3.9 \times 10^{-7}$ Torr.

When the obtained GaInNP layer was evaluated by X-ray diffraction, it was found out that a half width of a {400} diffraction spectrum was a significantly small and good value, 15 seconds. As described above, a high quality GaInNP mixed crystal layer can be obtained according to the present invention.

Although NH$_3$ was used as the nitrogen source in the above description in the third embodiment, other nitrogen materials exemplified in the first and second embodiments may also be used.

Fourth Embodiment

In a fourth embodiment of the present invention, a GaInNAs mixed crystal layer having a thickness of 1 μm was grown, under condition 2 of Table 1, on various surfaces which have various off-angles from a just {100} plane toward the (small plane of a GaAs substrate having a zinc blende structure. In the obtained GaInNAs mixed crystal layer, relations between the off-angle of the substrate surface and the nitrogen content in the Group V elements were examined by utilizing the peak energy of PL emission and the X-ray diffraction peak position. The result is shown in FIG. 4.

In the graph of FIG. 4, the abscissa denotes the off-angle (degrees) from the just {100} plane through the {11} plane to a <011> direction of the GaAs substrate, and the ordinate denotes the nitrogen content (at. %) in the Group V elements in the GaInNAs mixed crystal layer. As can been seen from FIG. 4, the nitrogen content of the obtained GaInNAs mixed crystal layer increases when the substrate surface has an off-angle toward a {111}A plane. However, the content does not increase when the substrate has an off-angle toward a {111}B plane. This could be because the decomposition efficiency of the nitrogen compound at surface steps with the Group III element is higher than that at surface steps with the Group V element.

It is noted that the {111}A plane is a {111} plane which is terminated by cation atoms and the {111}B plane is a {111} plane which is terminated by anion atoms. In the case of a III-V compound semiconductor, the cation atom is a III group element and the anion atom is a V group element.

From the result of FIG. 4, it can be expected that the incorporation efficiency of nitrogen into the mixed crystal layer to be grown is improved by use of the substrate surface which has an off-angle of 3 to 20° from the {100} plane toward the {111}A plane. Especially, in the case of an off-angle of 5 to 15°, a much higher incorporation efficiency of nitrogen can be expected.

Then, a quantum well structure as shown in FIG. 1 was formed, under condition 2 of Table 1, similarly to the first embodiment except that the off-angle of the GaAs substrate surface was variously changed. Relations between the PL emission intensity of the quantum well structure thus obtained and the off-angle are shown in FIG. 5.

Figure 5:
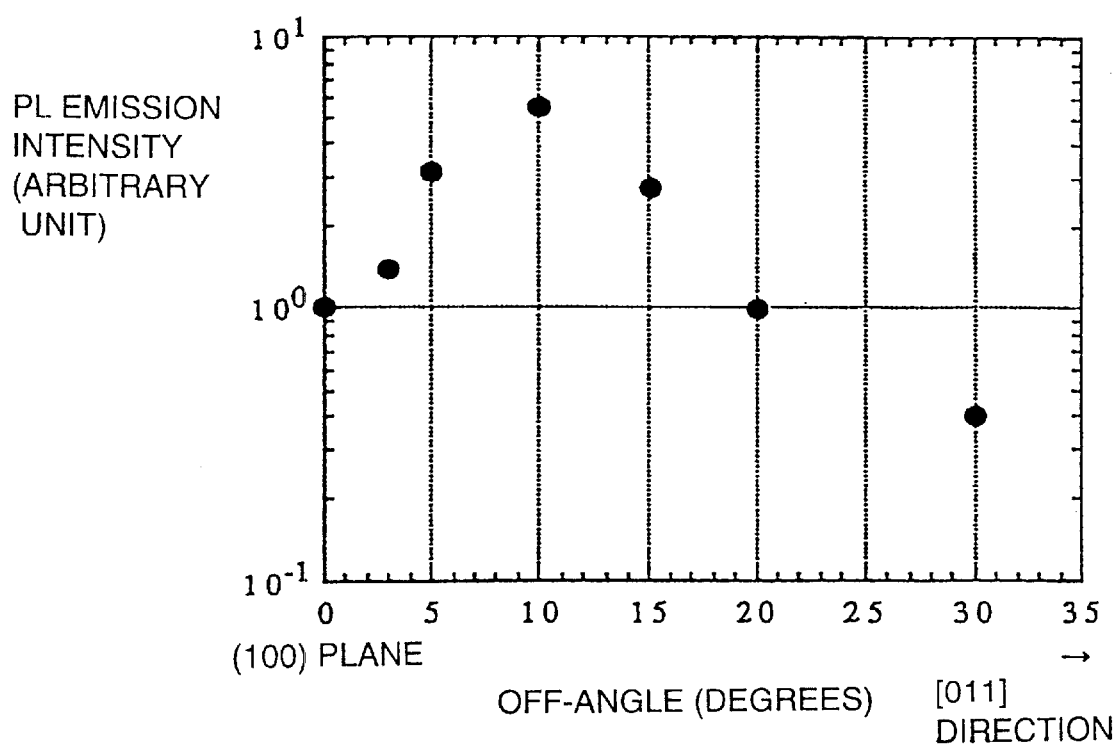
FIG. 5 is a graph showing the relationship between the PL emission intensity in the quantum well structure formed in the fourth embodiment of the present invention and the off-angle of the substrate surface.

In FIG. 5, the abscissa denotes the off-angle of the substrate surface similarly to FIG. 4, while the ordinate denotes the PL emission intensity (arbitrary unit). As shown in FIG. 5, the PL emission intensity can be increased when the off-angle of the substrate surface is in a range of 5 to 15°. This could be because the incorporation efficiency of nitrogen during mixed crystal layer growth is increased and the crystallinity of the mixed crystal layer is improved by the effects of the substrate surface off-angle. When the off-angle of the substrate surface is more than 20°, however, the PL emission intensity of the quantum well structure conversely tends to reduce. This could be because when the off-angle of the substrate surface is more than 20°, the surface is roughened. As described above, the PL emission intensity of the quantum well structure can be improved by setting the substrate surface off-angle in the range of 5 to 15° from the {100} plane toward the {111}A plane.

In the fourth embodiment, of course, nitrogen compounds other than NH$_3$, as exemplified in the first and second embodiments, can also be utilized as the nitrogen source.

Fifth Embodiment

Figure 6:
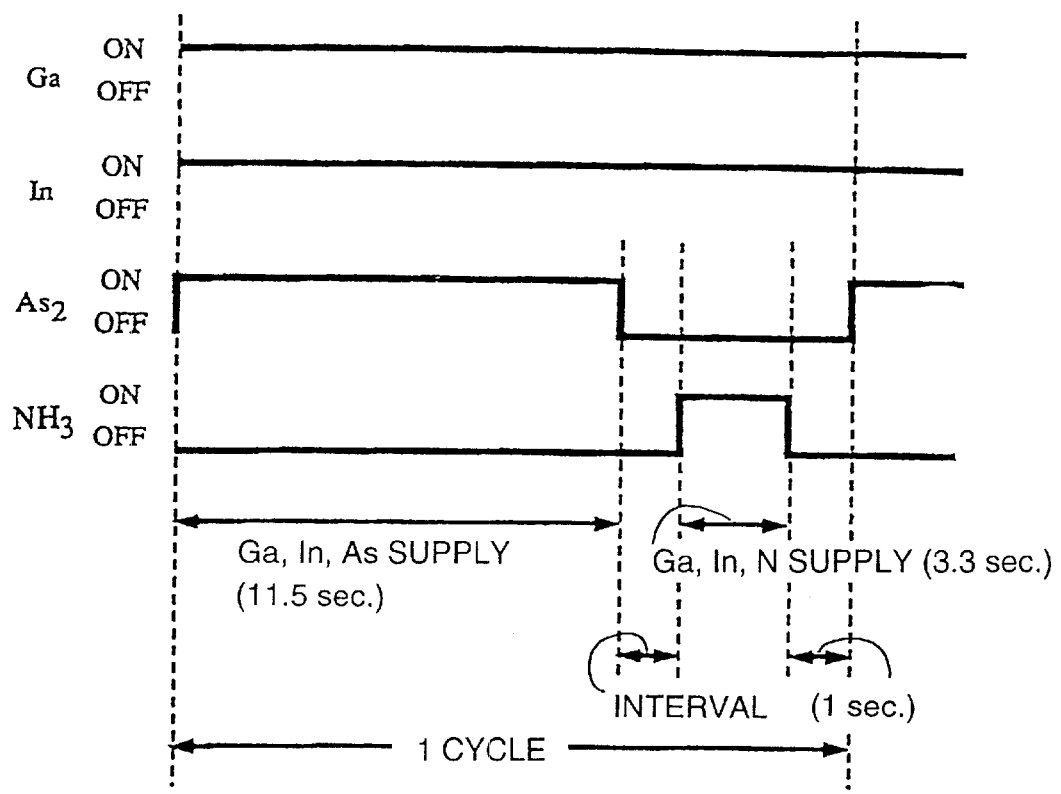
FIG. 6 is a timing chart for explaining a material supply sequence for growing a GaInNAs layer in a fifth embodiment of the present invention.

In a fifth embodiment of the present invention, a quantum well structure as shown in FIG. 1 was formed similarly to the first embodiment except that a nitrogen source (NH$_3$) and an arsenic source (As$_2$) were supplied on the substrate surface not simultaneously but alternately during growth of quantum well layer 3. FIG. 6 is a timing chart showing the sequence of supplying materials on the {100} plane of the GaAs substrate. As can be seen from FIG. 6, for III group elements Ga and In, molecular beams were always directed to the substrate surface while GaInNAs quantum well layer 3 was grown. For Group V elements, however, the arsenic source (As$_2$) was supplied on the substrate surface for 11.5 seconds and, after an interval of 1 second, the nitrogen source (NH$_3$) was supplied for 3.3 seconds. The sequence was repeated multiple times at an interval of 1 second.

Intensities of molecular beams were so set that Ga=$2.5 \times 10^{-7}$ Torr, In=$2.5 \times 10^{-8}$ Torr, As$_2$=$2.5 \times 10^{-6}$ Torr, and NH$_3$=$5 \times 10^{-6}$ Torr. By such molecular beam intensities, approximately 3 molecular layers of GaInNAs are grown in one cycle of the sequence for supplying nitrogen and arsenic sources.

In the source supply sequence as shown in FIG. 6, Ga, In and nitrogen are incorporated into the crystal during the supply of the nitrogen source, and Ga, In and As are incorporated into the crystal during the supply of the arsenic source. If the thickness of the mixed crystal to be grown in one cycle of the source supply sequence is set in a range of about 0.5 to 5 molecular layers, a mixed crystal with almost uniform composition can be obtained. Further, by suitably adjusting the molecular beam intensities and supply times of nitrogen and arsenic sources, the mixed crystal composition can be controlled.

According to the source supply method as in the fifth embodiment, the nitrogen material and the material of the Group V element other than nitrogen are independently supplied. Therefore, competition between nitrogen and the other Group V element with respect to incorporation into the crystal can be avoided, and the incorporation efficiency of nitrogen into the crystal can be improved. As a result, the quantum well structure according to the fifth embodiment can have increased PL emission intensity and obtain a high quality GaInNAs/AlGaAs-SQW structure compared with a quantum well structure formed by simultaneous supply of nitrogen and the other Group V element on the substrate surface.

In the fourth embodiment, of course, other nitrogen compounds other than $NH_3$, exemplified in the first and second embodiments, can also be utilized as the nitrogen source. Further of course, a substrate surface having an off-angle at a surface other than the just {100} surface of the substrate can also be used in the fifth embodiment.

Sixth Embodiment

In a sixth embodiment of the present invention, a quantum well structure as shown in FIG. 1 was formed similarly to the first embodiment except that the heating temperature of $NH_3$ in a gas cell was variously changed. $NH_3$ supplied to the gas cell from a gas supply line was heated to a prescribed temperature by passing through the heating portion in the gas cell. Thereafter, $NH_3$ was supplied on the growth surface. The intensity of each molecular beam during growth of GaInNAs layer 3 was so fixed that the In content in the Group III element was 7.1 at. % and the nitrogen content in the Group V element was 2.5 at. % under the condition that the heating temperature of $NH_3$ gas was 350° C. Relations between the heating temperature of $NH_3$ gas and the PL emission characteristics in the quantum well structure thus formed are shown in FIG. 7.

Figure 7:
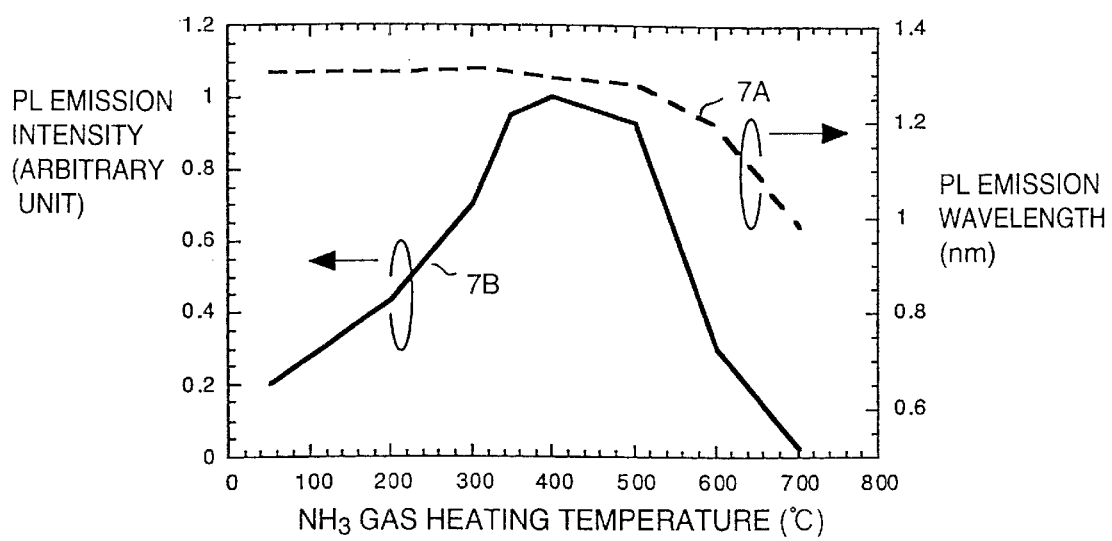
FIG. 7 is a graph showing the relationship between the heating temperature of a $NH_3$ gas and the wavelength and intensity of PL emission in a quantum well structure in a sixth embodiment of the present invention.

In the graph of FIG. 7, the abscissas denotes the heating temperature (° C.) of $NH_3$ gas, the ordinate on the left side denotes the PL emission intensity (arbitrary unit), and the ordinate on the right side denotes the wavelength (nm) at the PL emission intensity peak. Further, the dashed curve 7A indicates the PL emission wavelength and the solid curve 7B indicates the PL emission intensity.

As can been seen from the curve 7A, the wavelength at the emission intensity peak becomes shorter when the heating temperature of $NH_3$ gas is 500° C. or more. This could be because $NH_3$ decomposes and forms stable $N_2$ molecules at the heating temperature of 500° C. or more, and therefore the amount of nitrogen incorporation decreases at the growth surface, which in turn decreases the nitrogen content of the GaInNAs layer. the other hand, as can been seen from the curve 7B, heating $NH_3$ gas to 100° C. or more increases the PL emission intensity and remarkably increases the emission intensity especially in a heating temperature range of 350 to 500° C. If $NH_3$ gas is heated to a temperature of 500° C. or more, however, the PL emission intensity abruptly decreases with increase of the temperature.

The reason why the emission intensity is increased by heating $NH_3$ gas could be that the increased thermal energy of $NH_3$ molecules promotes migration of the $NH_3$ molecules on the growth surface. Especially when the heating temperature of $NH_3$ gas is in the range of 350 to 500° C., the effects of $NH_3$ molecule migration may be significant. On the other hand, the reason why the emission intensity decreases when the heating temperature of $NH_3$ gas is 500° C. or more could be that crystal defects, caused by deviation from the lattice matching condition with the GaAs substrate, occur with decrease of the incorporation efficiency of nitrogen into the crystal.

In summary, the heating temperature of $NH_3$ gas is preferably less than 500° C. in view of the PL emission wavelength and the crystallinity of the GaInNAs layer. For the crystallinity of the GaInNAs layer, the heating temperature of $NH_3$ gas is preferably at least 100° C. and more preferably at least 350° C.

Although the solid materials were used as the materials other than nitrogen in the description above in the sixth embodiment, t-butylarsine (TBAs), trisdimethylaminoarsine (TDMAAs) and the like can also be used as As source, and the organometallic compounds of Ga and In can also be used as Group III element sources.

Seventh Embodiment

In a seventh embodiment of the present invention, the mixed crystal layer of a III-V compound semiconductor which includes nitrogen and other Group V elements was grown by using monomethylhydrazine (MMHy) as a nitrogen source.

Dependency of the nitrogen content of a GaAsN mixed crystal layer on the substrate temperature was first examined by growing the GaAsN mixed crystal layer, using MMHy, at various substrate temperatures on the {100} plane of the GaAs substrate. Although the Ga material was supplied similarly to the case of the first embodiment, the As material was supplied as an $As_2$ molecular beam by heating t-butylarsine (TBAs) to 600° C. Other crystal growth conditions were so set that the incorporation efficiency of nitrogen into the GaAsN layer was at the highest value and the nitrogen content in the Group V elements was nearly saturated 10 at. %. Further, the GaAsN layer was also grown under the same conditions except that $NH_3$ was used in stead of MMHy. Relations between the nitrogen content in the thus obtained GaAsN layer and the substrate temperature are shown in FIG. 8.

Figure 8:
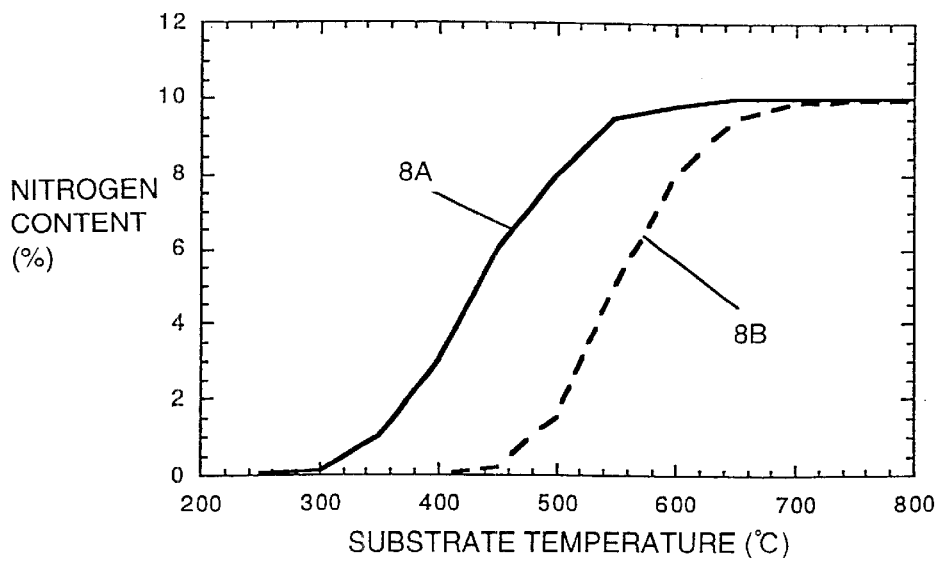
FIG. 8 is a graph showing the relationship between the nitrogen content in a GaInNAs layer formed in a seventh embodiment of the present invention and the substrate temperature.

In the graph of FIG. 8, the abscissa denotes the substrate temperature (° C.), and the ordinate denotes the nitrogen content (at. %) in the V group elements in the GaAsN layer. Solid and dashed curves 8A and 8B indicate the nitrogen content in the GaAsN layer when MMHy and $NH_3$ are used, respectively.

As can been seen from the curve 8A, in the case of MMHy, there is a tendency that the GaAsN layer grows when the substrate temperature is about 350° C. or more, and the nitrogen content increases with increase of the substrate temperature and saturates at about 600° C. or more. As can also been seen from the curve 8B, in the case of $NH_3$, the GaAsN layer grows at about 450° C. or more, and the nitrogen content increases with increase of the substrate temperature and saturates at about 700° C. From the result of FIG. 8, it can be found out that the use of MMHy as the nitrogen source can grow the mixed crystal layer at a lower temperature compared with the case of $NH_3$ when the III-V compound semiconductor which includes nitrogen and another V group element is to be grown.

Although TBAs was used to exemplify a possible use of various arsenic sources in FIG. 8, the tendency in FIG. 8 is not changed very much even when a solid material is used as an arsenic source similarly to the case of the first embodiment.

Then, a quantum well structure as shown in FIG. 1 was formed similarly to the first embodiment except that $NH_3$ or MMHy was used as the nitrogen source and the substrate was maintained at 500° C. during growth of quantum well layer 3. For the composition of GaInNAs layer 3, the conditions of each molecular beam were so optimized that the In content in the Group III elements was 7.1 at. % and the N content in the Group V elements was 2.5 at. % to obtain the emission wavelength of 1.3 μm. The PL emission intensity in the obtained quantum well structure is shown in FIG. 9.

Figure 9:
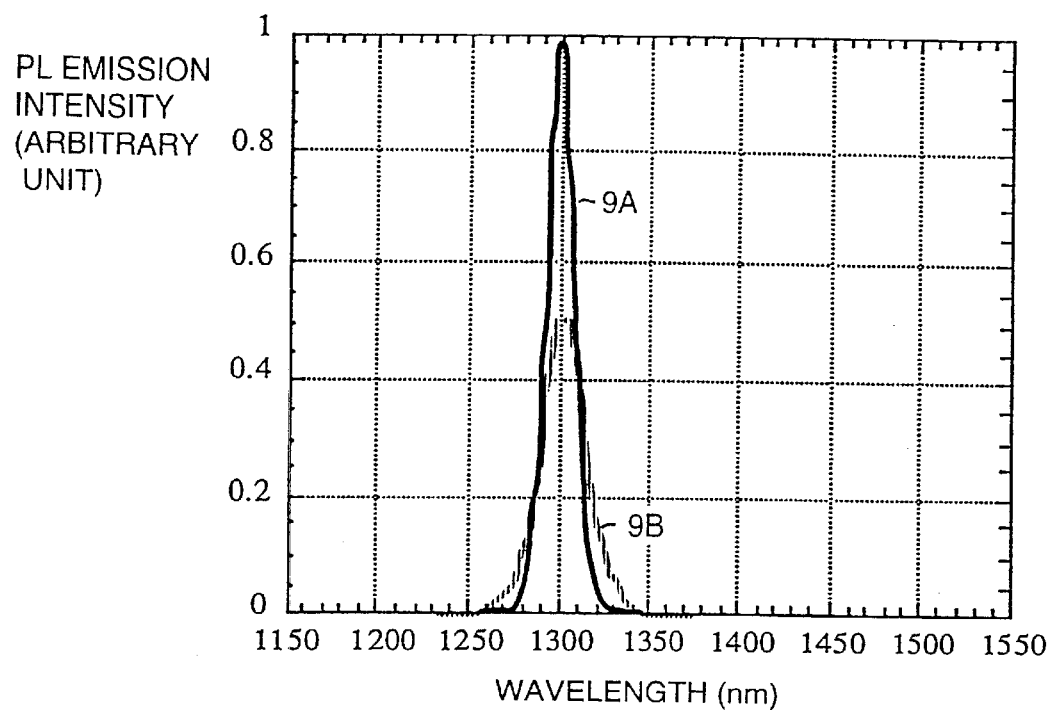
FIG. 9 is a graph showing the relationship between the wavelength and intensity of PL emission in the quantum well structure formed in the seventh embodiment.

In the graph of FIG. 9, the abscissa denotes the PL emission wavelength (nm) of the quantum well structure and the ordinate denotes the PL emission intensity (arbitrary unit). Further, solid and dashed curves 9A and 9B indicate the PL emission intensity when MMHy is used and when $NH_3$ is used, respectively. As is apparent from the result of FIG. 9, with the substrate temperature of 500° C., PL emission which has a high peak and a small half width is obtained in a quantum well structure formed by using not $NH_3$ but MMHy and this means that a high quality GaInNAs quantum well 3 has been formed. With the substrate temperature of about 600° C. or more, however, superior PL emission characteristics are observed in a semiconductor laser which is formed by using not MMHy but $NH_3$.

The reason why the effects of $NH_3$ and MMHy are different as described above could be that the decomposition efficiency of $NH_3$ on the growth surface decreases when the substrate temperature is low, and therefore $NH_3$ molecules which have not yet decomposed hinder crystal growth and deteriorate the crystallinity. It is considered that, under the conditions that the substrate temperature is high and $NH_3$ and MMHy both can easily decompose, superior crystallinity can be attained when $NH_3$ is used which has relatively low reactivity and is less likely to induce defects at the growth surface.

Although MMHy was used as a hydrazine based compound in the above description of the seventh embodiment, hydrazine ($N_2H_4$), dimethylhydrazine (DMHy) and the like can also be used as preferable nitrogen sources in the similar substrate temperature range. Since carbon may be incorporated as impurities into the crystal when DMHy is used, however, MMHy including fewer alkyl groups than DMHy and $N_2H_4$ not including any alkyl group are more preferred because they can suppress the incorporation of carbon impurity into the crystal.

Eighth Embodiment

In an eighth embodiment of the present invention, a quantum well structure as shown in FIG. 1 was formed similarly to the first embodiment except that the conditions of forming quantum well layer 3 were changed. In the eighth embodiment, various materials having different energies of formation as shown in Table 5 were used as the nitrogen material, and the substrate was maintained at a temperature optimum for using each nitrogen material during formation of quantum well layer 3. The molecular beam intensities of Ga, In, As and nitrogen material were so set that the In content in the Group III elements was 7.1 at. % and the nitrogen content in the Group V elements was 2.5 at. % in quantum well layer 3.

TABLE 5

| Nitrogen compounds | Gibbs energy of formation (2980K) $\Delta G(kJ/mol)$ |
|---|---|
| Ammonia ($NH_3$) | −103.4 |
| Hydrazine ($N_2H_4$) | 23.8 |
| Monomethylhydrazine ($CH_3N_2H_3$) | 11.5 |
| Hydrogen azide ($N_3H$) | 222.8 |
| Nitrogen radical (N*) | 427.2 |

Figure 10:
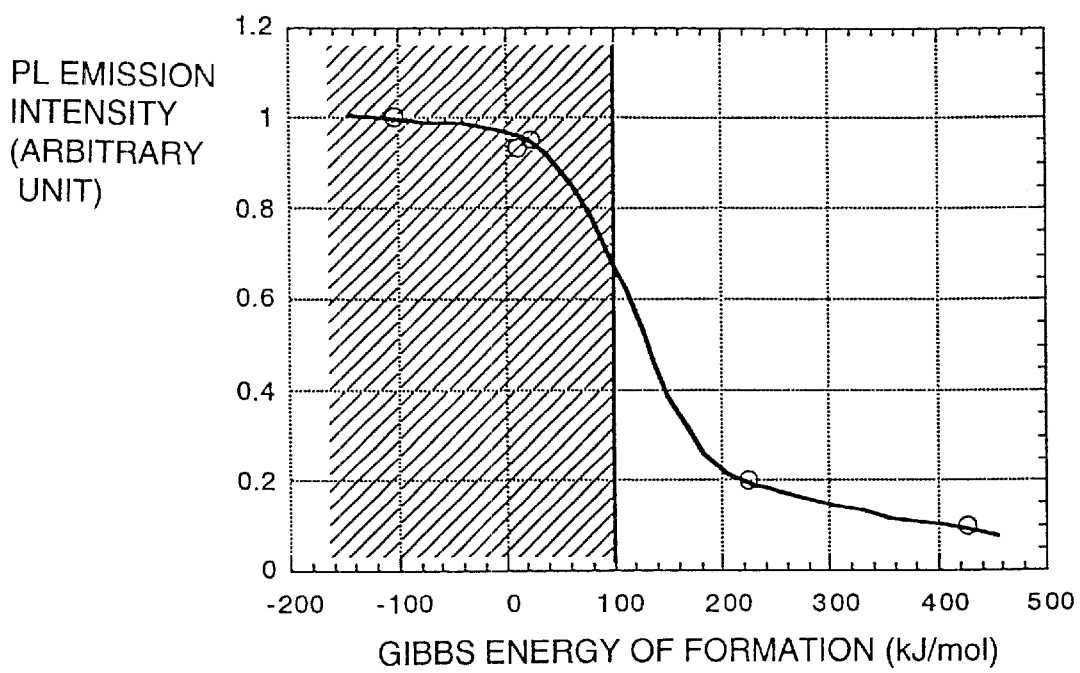
FIG. 10 is a graph showing the relationship between the PL emission intensity of a quantum well structure formed in an eighth embodiment of the present invention and the Gibbs energy of formation of a nitrogen material.

FIG. 10 shows relations between the PL emission spectrum intensity in the quantum well structure and the Gibbs energy of formation of nitrogen sources in the eighth embodiment. In FIG. 10, the abscissa denotes the Gibbs energy of formation (kJ/mol) at 298K in the nitrogen source used for forming quantum well layer 3, and the ordinate denotes the PL emission intensity (arbitrary unit). As is apparent from FIG. 10, the PL emission intensity tends to be increased by using the nitrogen source having smaller Gibbs energy of formation compared with nitrogen radical. Especially by using the nitrogen material having Gibbs energy of formation smaller than about 100 kJ/mol, a high quality GaInNAs/AlGaAs-SQW structure having high PL emission intensity can be obtained.

Although the just {100} crystal plane was used as a substrate surface in the above description of the eighth embodiment, the tendency shown in FIG. 10 does not change very much even when a substrate surface having an off-angle is used. Although the $Al_{0.3}Ga_{0.7}As$ layers were used as clad layers 2,4, the tendency shown in FIG. 10 does not change very much even when GaInP capable of lattice matching with the GaAs substrate is used.

Ninth Embodiment

In a ninth embodiment of the present invention, a semiconductor laser was produced including the active layer of GaInNAs-SQW formed by the MBE method in which $NH_3$ was used as the nitrogen source and solid materials were used as the other element sources similarly to the first embodiment.

Figure 11:
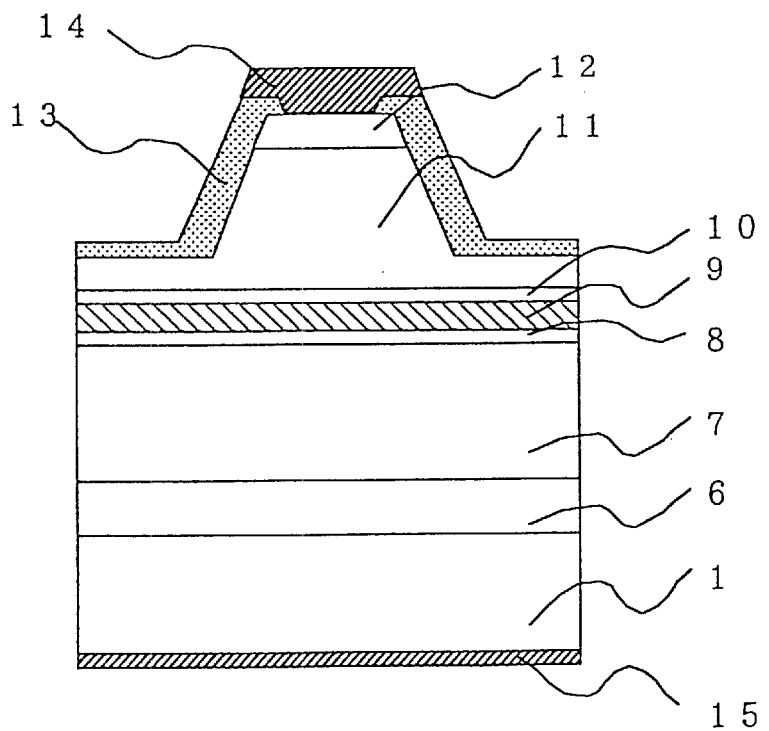
FIG. 11 is a schematic sectional view for explaining a semiconductor laser formed in a ninth embodiment of the present invention.

FIG. 11 shows a schematic sectional view of this semiconductor laser including the GaInNAs-SQW structure. In the semiconductor laser, a buffer layer 6 of n-type GaAs having a thickness of 0.5 μm, an n-type clad layer 7 of n-type $Al_{0.3}Ga_{0.7}As$ having a thickness of 1 μm, an n-type guide layer 8 of n-type GaAs having a thickness of 0.15 μm, an SQW layer 9 of non-doped $Ga_{0.929}In_{0.071}N_{0.025}As_{0.975}$, a p-type guide layer 10 of p-type GaAs having a thickness of 0.15 μm, a p-type clad layer 11 of p-type $Al_{0.3}Ga_{0.7}As$ having a thickness of 0.5 μm, and a contact layer 12 of p-type GaAs having a thickness of 0.1 μm were successively grown, by the MBE method, on an n-type GaAs substrate 1 which has a just {100} crystal surface. For growing these layers, the same conditions of the substrate temperature, the $NH_3$ gas heating temperature and the like as the first embodiment were applied. For growing $Ga_{0.929}In_{0.071}N_{0.025}As_{0.975}$ layer 9, the growth conditions as shown in condition 2 of Table 1 were adopted.

After the semiconductor layers were grown and laminated, part of p-type $Al_{0.3}Ga_{0.7}As$ clad layer 11 and p-type GaAs contact layer 12 were etched away to form a mesa stripe shape, and an insulation layer 13 of polyamide was formed to cover the etched portion. Further, upper and lower electrodes 14 and 15 were formed to complete a ridge stripe laser as shown in FIG. 11.

In the semiconductor laser, continuous emission of light at a wavelength of 1.3 μm was observed at room temperature with resonator end surfaces supplied with λ/2 coating, the threshold current was 15 mA, and the slope efficiency was 0.35 W/A. Although the characteristic temperature of a conventional semiconductor laser is about 50° K., the characteristic temperature of the semiconductor laser in this embodiment was improved to 170K in a range from room temperature to 85° C. (this means that increase of threshold current for laser oscillation with increase of temperature was reduced). As a result of conducting a reliability test by driving the semiconductor laser in this embodiment at 60° C. and at an output of 10 mW, it was observed that the semiconductor laser has a life of at least 5000 hours (time till the drive current increases by 20% compared with the initial current).

By thus utilizing the method of manufacturing a compound semiconductor according to the present invention, a semiconductor laser for optical communication was obtained which has a high characteristic temperature and a low threshold current and which is highly reliable and high performance. Although $NH_3$ was used as the nitrogen source in the ninth embodiment, a semiconductor laser having similar performance can be obtained even if nitrogen compounds having Gibbs energy of formation smaller than 100 kJ/mol such as dimethylamine and MMHy described in other embodiments are used. Further, by changing the composition of the GaInNAs active layer, a semiconductor laser having superior performance even in the wavelength band including 1.55 µm can be obtained.

It is noted that the MBE method described in the above embodiments are used as a wide concept covering the GSMBE method, the CBE method, the MOMBE method as described above, gas such as $AsH_3$ can be used as the V group element material, and organic metals such as trimethylgallium (TMGa), trimethylaluminum (TMA1) and trimethylindium (TMIn) can be used as the Group III element materials. In short, by using the MBE method in a broad sense which grows a compound semiconductor crystal by irradiating a substrate with molecular beams in a chamber so evacuated that the mean free path of material molecules is at least the distance between the substrate and the molecular beam sources, each material molecule reacts only on the growth surface and therefore various materials can be applied to the present invention.

In the various above embodiments, the GaInNAs mixed crystal that has the N content $\leq 3.5$ at. % in the Group V element and is capable of lattice matching with a GaAs substrate and the GaInNP mixed crystal that has the N content=3 at. % and is capable of lattice matching with the GaP substrate are used as a III-V compound semiconductor which includes nitrogen and another Group V element. However, the present invention can be applied for growing not only mixed crystals of GaInNAs and GaInNP having other different nitrogen concentrations but a mixed crystal layer of a III-V compound semiconductor which includes nitrogen, at least one of other Group V elements As, P, Sb and Bi, and at least one of Group III elements B, Al, Ga, In and Tl.

INDUSTRIAL APPLICABILITY

As described above, according to the present invention, a high quality mixed crystal layer can be obtained without causing crystal defects during the MBE growth of the mixed crystal layer of a III-V compound semiconductor including nitrogen and at least another Group V element. Therefore, high quality optoelectronic devices can be provided by utilizing such high quality mixed crystals.

What is claimed is:

1. A method of manufacturing a compound semiconductor characterized in that:
    said compound semiconductor is grown on a substrate by molecular beam epitaxy,
    said compound semiconductor comprises III-V compound semiconductor which comprises nitrogen and at least another Group V elemant, and a nitrogen compound is used as a nitrogen source, wherein molecules of said nitrogen compound decompose after the molecules reach a surface of the substrate.

2. The method of manufacturing a compound semiconductor according to claim 1 characterized in that a nitrogen hydride is used as said nitrogen source.

3. The method of manufacturing a compound semiconductor according to claim 2 characterized in that ammonia is used as said nitrogen hydride.

4. The method of manufacturing a compound semiconductor according to claim 3 characterized in that said substrate is maintained at a temperature in a range of 500 to 750° C. during growing said semiconductor.

5. The method of manufacturing a compound semiconductor according to claim 3 characterized in that said ammonia is heated to a temperature in a range of 350 to 500° C. and thereafter irradiated to said substrate.

6. The method of manufacturing a compound semiconductor according to claim 3, wherein the ammonia is heated to a temperature of 100 to 350° C. and thereafter irradiated to the substrate.

7. The method of manufacturing a compound semiconductor according to claim 2 characterized in that hydrazine is used as said nitrogen hydride.

8. The method of manufacturing a compound semiconductor according to claim 7 characterized in that said substrate is maintained at a temperature in a range of 350 to 750° C. during growing said semiconductor.

9. The method of manufacturing a compound semiconductor according to claim 2 characterized in that an alkylated hydrazine compound is used as said nitrogen source.

10. The method of manufacturing a compound semiconductor according to claim 9 characterized in that said substrate is maintained at a temperature in a range of 350 to 750° C. during growing said semiconductor.

11. The method of manufacturing a compound semiconductor according to claim 1 characterized in that an alkylated nitrogen compound is used as said nitrogen source.

12. The method of manufacturing a compound semiconductor according to claim 11 characterized in that an alkylamine is used as said alkylated nitrogen compound.

13. The method of manufacturing a compound semiconductor according to claim 12 characterized in that said substrate is maintained at a temperature in a range of 400 to 750° C. during growing said semiconductor.

14. The method of manufacturing a compound semiconductor according to claim 1 characterized in that said substrate is formed of a a compound semiconductor having a zinc blende structure, and has a prescribed off-angle from a {100} plane toward a {111}A plane.

15. The method of manufacturing a compound semiconductor according to claim 14 characterized in that said off-angle is in a range of 5 to 15°.

16. The method of manufacturing a compound semiconductor according to claim 1 characterized in that a nitrogen compound having Gibbs energy of formation smaller than 100 kJ/mol is used as said nitrogen source.

17. The method of manufacturing a compound semiconductor according to claim 16 characterized in that said III-V compound semiconductor has a nitrogen concentration of 1 to 3.5 at. %.

18. The method of manufacturing a compound semiconductor according to claim 1 characterized in that said III-V compound semiconductor has a nitrogen concentration of 1 to 3.5 at. %.

19. The method of manufacturing a compound semiconductor according to claim 18 characterized in that at least another Group V element included together with nitrogen in said III-V compound semiconductor is arsenic (As).

20. The method of manufacturing a compound semiconductor according to claim 18 characterized in that ammonia is used as said nitrogen source.

21. The method of manufacturing a compound semiconductor according to claim 18 characterized in that alkylamine is used as said nitrogen source.

22. The method of manufacturing a compound semiconductor according to claim 18 characterized in that hydrazine or an alkylated hydrazine compound is used as said nitrogen source.

23. The method of manufacturing a compound semiconductor according to claim 1 characterized in that said substrate is GaAs.

24. A method of manufacturing a compound semiconductor characterized in that:
    said compound semiconductor is grown on a substrate by molecular beam epitaxy, said compound semiconductor comprises III-V compound semiconductor which comprises nitrogen and at least another Group V element, and a nitrogen compound is used as a nitrogen source, wherein when the Group V elements are supplied on said substrate, the steps of irradiating the nitrogen material and irradiating the Group V material other than nitrogen to the substrate are alternately carried out without being overlapped.

25. A method of manufacturing a compound semiconductor characterized in that:

said compound semiconductor is grown on a substrate by molecular beam epitaxy, said compound semiconductor comprises III-V compound semiconductor which comprises nitrogen and at least another Group V element, and a nitrogen compound is used as a nitrogen source, wherein molecules of said nitrogen compound decompose after the molecules reach a surface of the substrate, and nitrogen atoms form bonds only with atoms of the Group III element or elements and do not form bonds with atoms of said at least another Group V element.

26. A method of manufacturing a compound semiconductor characterized in that:

said compound semiconductor is grown on a substrate by molecular beam epitaxy;

said compound semiconductor comprises III-V compound semiconductor which comprises nitrogen and at least another Group V element, and a nitrogen compound is used as a nitrogen source; and said substrate is formed of a compound having a zinc blend crystal structure, and has a prescribed off-angle from a {100} plane toward a {111}A plane, whereby the off-angle improves an incorporation efficiency of nitrogen into the crystal.

* * * * *